United States Patent [19]

Taumberger

[11] Patent Number: 4,906,065
[45] Date of Patent: Mar. 6, 1990

[54] ELECTRO-OPTICAL ASSEMBLY

[75] Inventor: Franz Taumberger, Munich, Fed. Rep. of Germany

[73] Assignee: Siemens Aktiengesellschaft, Berlin and Munich, Fed. Rep. of Germany

[21] Appl. No.: 246,740

[22] Filed: Sep. 20, 1988

[30] Foreign Application Priority Data

Sep. 25, 1987 [DE] Fed. Rep. of Germany ....... 3732393

[51] Int. Cl.$^4$ .............................................. G02B 6/42
[52] U.S. Cl. ................................................ 350/96.20
[58] Field of Search ............... 350/96.20, 96.21, 96.22; 250/227; 357/17, 19, 30

[56] References Cited

U.S. PATENT DOCUMENTS 4,787,696 11/1988 Norris et al. ..................... 350/96.20

FOREIGN PATENT DOCUMENTS 555291 6/1986 Australia .

Primary Examiner—Frank Gonzalez
Attorney, Agent, or Firm—Hill, Van Santen, Steadman & Simpson

[57] ABSTRACT

A receiver module for light waveguide transmission is mounted in a module housing with high precision without risk of contamination to optical surfaces by a film circuit including an intergrated circuit and an amplifier element being is pressed together against the housing floor by z-shaped retaining angles. The retaining angles are welded to metallized edge strips of the substrate before the introduction of the electro-optical components and are joined to the housing floor by laser welding.

9 Claims, 1 Drawing Sheet

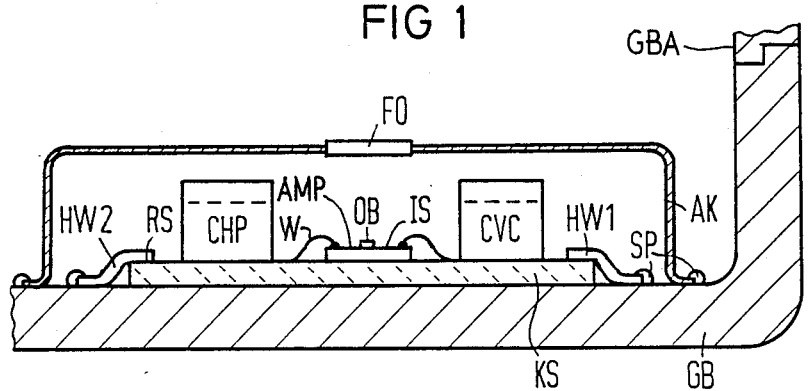
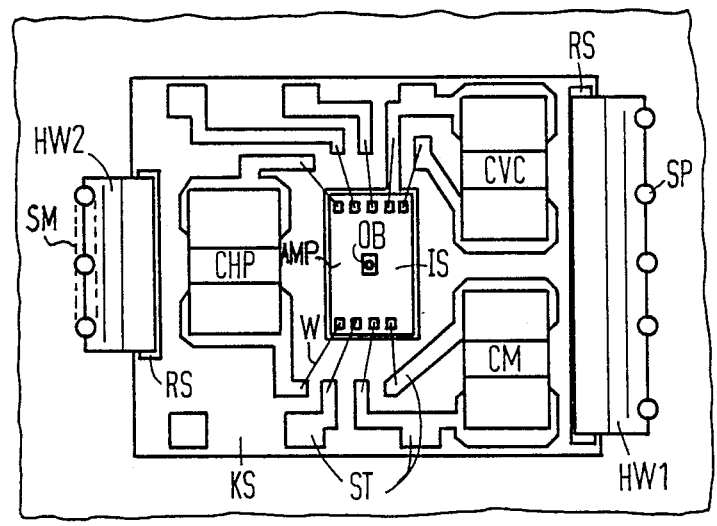

ELECTRO-OPTICAL ASSEMBLY

BACKGROUND OF THE INVENTION

1. Field of the Invention

The present invention is related generally to an electro-optical assembly and more particularly to an assembly including optical components and at least one opto-electrical component on a substrate, the substrate being contained within a sealed housing.

2. Description of the Related Art

During the development of electro-optics, and particularly during the development of signal transmission through light waveguides, assemblies of optical components and electrical components such as, for example, film circuits are united. A problem exists during the manufacture of such assemblies in that the optical components have to be protected from even the slightest contamination which would reduce the already low light amplitudes in the waveguides. Standard methods for fastening film circuits in a housing include soldering with a fluxing agent or gluing with an adhesive which usually contains a solvent. These methods cannot be used in combination with optical components due to the risk of contamination, particularly of the optical surfaces of the optical components.

In the European patent application EP-82-0118677, for example, is disclosed a method and apparatus for setting a light receiving end of a light conductor in the focus of a lens. The light conducting element is joined firmly to the lens carrying element with the assistance of glue. Insofar as optically effective surfaces are exposed, there is a risk of contamination of the components by the epoxy resin glue or by the solvent of the adhesive.

An additional problem occurring during the manufacture of electro-optical assemblies is that an extremely precise alignment and assembly of the optical and opto-electrical components must be provided. This is due to the small dimensions of the light waveguides and of the light rays being transmitted. Particularly when mounting film circuits which contain electro-optical components, a problem arises that neither the standard mounting methods for optics nor the fastening methods for film circuit technology can be used.

SUMMARY OF THE INVENTION

An object of the present invention is to provide a high precision, positionally correct mounting for film circuit containing an opto-electrical component in a metal housing containing optical components without the use of glue or solder.

This and other objects are inventively achieved by an electro-optical assembly in which at least two metallic, strip-shaped retaining angles, or angle pieces, are planarly secured on a surface of a substrate which carries a film circuit at respective edge strips of the substrate lying opposite one another. The retaining angles extend over at least part of the edge strip of the substrate and have an approximately Z-shaped cross section. The retaining angles are joined to the housing floor parallel to the edge strip of the substrate by, for example, spot welds. Expedient developments of the electro-optical assembly of the invention include providing a metallic shield cap to cover the substrate having the film circuit, the metallic shield cap having a light transmissive opening above the opto-electrical component contained in the film circuit. The shield cap is joined to the housing floor by spot welds as well. In a further development, the retaining angles have a coefficient of thermal expansion which roughly corresponds to that of the substrate. In yet another development, the retaining angles have a coefficient of thermal expansion lying between the coefficient of thermal expansion of the substrate and that of the housing floor to which it is attached. In another embodiment, the spot welds are joined together to form a welded seam.

A method for manufacturing an electro-optical assembly is also provided by the present invention in which the housing and the film circuit which has metallized edge strips are manufactured separately. Subsequently, the retaining angles are secured to the metallized edge strips of the film circuit and, thereafter, the film circuit together with the retaining angles is introduced into the housing and adjusted on the housing floor. The retaining angles are then welded to the housing floor. The shield cap is adjusted so that the optical window thereof is above the film circuit and the shield cap is welded to the housing floor. In conclusion, the housing is completed by incorporating further component parts and housing parts and tightly closing the housing.

The electro-optical assembly of the invention advantageously does not require cleaning, such as of the optical surfaces, after assembly. Furthermore, before the opto-electrical components are inserted into the film circuit, the film circuit can advantageously be manufactured by one of the standard manufacturing methods so that the described format is suitable for any of a plurality of different film circuits.

BRIEF DESCRIPTION OF THE DRAWINGS

FIG. 1 is an elevational cross section through an electro-optical assembly according to the principles of the present invention; and FIG. 2 is a plan view of the assembly of FIG. 1 with the shield cap removed.

DESCRIPTION OF THE PREFERRED EMBODIMENTS

In FIG. 1, a metallic housing floor GB is shown which is part of a metal housing GBA in which a receiver module for optical transmissions through light waveguides as well as a mirror and an optical filter are integrated. An integrated circuit IS having an optical-electrical component OB is secured to a ceramic substrate KS which in turn is mounted to the housing floor GB by retaining angles, or angle pieces, HW1 and HW2 having a z-shaped cross section. The opto-electrical component OB is part of a film circuit ST formed on the substrate KS. The retaining angles HW1 and HW2 are firmly joined to metallic edge strips RS lying on opposite sides of the substrate KS.

In addition to the opto-electrical component OB, the integrated circuit IS also contains an electrical amplifier arrangement AMP (not shown in detail). For this reason, the entire film circuit is preferrably protected against electrical interference by a metallic shield cap AK. An optical window FO in a form of a light transmissive glass pane is provided in the shield cap AK above the opto-electrical component OB of the film circuit ST.

The z-shaped retaining angles HW1 and HW2 are manufactured of Vacon 10, which has a coefficient of thermal expansion lying between that of the ceramic substrate KS and the housing floor GB. The retaining angles HW1 and HW2 as well as the shield cap AK are connected to the housing floor GB by weld spots SP which are produced laser welding methods. It is also possible to produce the spot welds SP by resistance welding. The heat flux or flow from the film circuit ST via the ceramic substrate KS to the housing floor GB and via the retaining angles HW1 and HW1 and the spot welds SP to the housing floor GB has proven completely adequate for heat elimination during circuit operation.

In the plan view in FIG. 2 of the electro-optical assembly of the invention, can be seen the retaining angles HW1 and HW2 which need not be of identical size. The first retaining angle HW1 extends over nearly the entire right-hand edge strip of the ceramic substrate KS, while the second retaining angle HW2 covers only a small part of the left-hand edge strip of the ceramic substrate KS. This assures that the retaining angles HW1 and HW2 do not come into contact with neighboring contact spots of the film circuit ST, thereby causing a short circuit in the electrical circuit. The retaining angles HW1 and HW2 are welded to the metallized strips RS on the substrate KS. As may be seen in the plan view of FIG. 2, three capacitor chips CHP, CVC, and CM are arranged on the substrate KS of the film circuit ST. The capacitor chips CHP, CVC and CM are in an electrically connected to the integrated circuit IS through contact strips of the film circuit ST and bonding wires W.

In the method for manufacturing the electro-optical assembly of FIGS. 1 and 2, the first method step includes producing the contact strips for the film circuit ST having contact spots for the capacitor CHP, CVC and CM as well as the metallized edge strips RS and a metallized carrier surface for the integrated circuit IS on the ceramic substrate KS. This is followed by the steps of equipping the film circuit ST with the individual components, fastening these components, for example, by thermal bonding, and fastening of the two retaining angles HW1 and HW2 on the edge strips RS. After this, the film circuit ST is adjusted on the housing floor GB in proper position with a maximum error of ±25 micrometers, and the retaining angles HW1 and HW2 are welded to the housing floor GB by laser welding. The retaining angles are fixed by the welds SP so that the ceramic substrate KS is pressed onto the housing floor GB in order to assure heat flow from the ceramic substrate KS to the housing floor GB. Instead of the weld spots SP, a welded seam SM can be formed by joining the spot welds together, as shown in broken outline in FIG. 2. In conclusion, the shielding cap AK having the optical window FO is adjusted over the film circuit so that the optical window FO lies above the opto-electrical component OB of the integrated circuit IS and the shield cap AK is thereafter joined to the housing floor GB with laser welding or resistance welding. Finally, other components (not shown) are mounted in the housing and the housing parts GBA and GB are sealed together. In view of the welding method used, the retaining angles HW1 and HW2 are nickel plated over their entire surface and may be partially gold plated. The shield cap AK is preferably nickel plated.

Although other modifications and changes may be suggested by those skilled in the art, it is the intention of the inventor to embody within the patent warranted hereon all changes and modifications as reasonably and properly come within the scope of his contribution to the art.

I claim:

1. An improved electro-optical assembly containing optical components, a film circuit arranged on a substrate and having at least one electro-optical component, the assembly being contained in a sealed housing having a metallic housing floor, the improvement comprising:
    at least two metallic strip-shaped retaining angle pieces being secured to respective opposite edge strips of the substrate, said retaining angle pieces being secured planarly to a surface side of the substrate carrying the film circuit, said retaining angle pieces extending over at least a part of the respective edge strips, said retaining angles angle pieces each having an approximately z-shaped cross section and being joined to the housing floor parallel to the edge strips of the substrate by welds.

2. An electro-optical assembly as claimed in claim 1, further comprising:
    a metallic shield cap shielding the substrate, said metallic shielding cap having a light transmissive opening above the electro-optical component of the film circuit, said shielding cap being joined to the housing floor by welds.

3. An electro-optical assembly as claimed in claim 1, wherein said retaining angle pieces have a coefficient of thermal expansion approximately equal to a coefficient of thermal expansion the substrate.

4. An electro-optical assembly as claimed in claim 1, wherein said retaining angle pieces have a coefficient of thermal expansion lying between a coefficient of thermal expansion of the substrate and a coefficient of thermal expansion of the housing floor.

5. An electro-optical assembly as claimed in claim 1, wherein said welds are spot welds.

6. An electro-optical assembly as claimed in claim 1, wherein said welds form a welded seam.

7. A method for manufacturing an electro-optical assembly, comprising the steps of:
    separately manufacturing a housing and a film circuit having metallized edge strips;
    securing retaining angle pieces to said metallized edge strips of said film circuit;
    positioning said film circuit together with said retaining angle pieces in said housing;
    welding said retaining angle pieces to a floor of said housing in position;
    positioning a shield cap over said film circuit with a light transmissive opening in said shield cap being above an electro-optical element in said film circuit;
    welding said shield cap to said floor of said housing to position; and
    incorporating further elements in said housing and sealing said housing.

8. An electro-optical assembly, comprising:
    a substrate;
    a film circuit formed on said substrate and including an electro-optical component;
    metallized strips extending along edge portions of said substrate;
    retaining angle pieces welded to said metallized strips on said substrate; and
    a metal housing floor, said substrate lying on said metal housing floor and said retaining angle pieces being welded to said metal housing floor.

9. An electro-optical assembly as claimed in claim 8, further comprising:
    a shield cap mounted over said substrate and being welded to said metal housing floor, said shield cap having a light transmissive opening positioned over said electro-optical component.

* * * * *